(12) United States Patent
Anderson et al.

(10) Patent No.: US 6,720,776 B2
(45) Date of Patent: Apr. 13, 2004

(54) INSTRUMENT WITH HOUSING HAVING RECESS FOR CONNECTORS

(75) Inventors: Mark A. Anderson, Portland, OR (US); Robert A. Bluhm, Beaverton, OR (US); Preston S. Gabel, Hillsboro, OR (US); Scott Ketterer, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/967,794

(22) Filed: Sep. 28, 2001

(65) Prior Publication Data

US 2003/0062906 A1 Apr. 3, 2003

(51) Int. Cl.[7] .......................... H01H 31/02; H05K 5/00; H05K 12/16; G06F 1/16
(52) U.S. Cl. ................. 324/555; 361/752; 361/683; 361/679; 361/690; 361/695
(58) Field of Search ................. 361/752, 683, 361/555, 679, 690, 695; 439/76.1, 248

(56) References Cited

U.S. PATENT DOCUMENTS

| 4,189,645 A | * | 2/1980 | Chaney et al. | 378/207 |
|---|---|---|---|---|
| 4,535,386 A | * | 8/1985 | Frey et al. | 361/389 |
| 5,070,429 A | * | 12/1991 | Skirpan | 361/358 |
| 5,161,088 A | * | 11/1992 | Burgher et al. | 361/383 |
| 5,202,538 A | * | 4/1993 | Skirpan | 174/65 R |
| 5,204,503 A | * | 4/1993 | Maiellano, Jr. et al. | 219/681 |
| 5,243,493 A | * | 9/1993 | Jeng et al. | 361/690 |
| 5,625,891 A | * | 4/1997 | Tucker et al. | 455/67.2 |
| 5,701,231 A | * | 12/1997 | Do et al. | 361/683 |
| 5,701,828 A | * | 12/1997 | Benore | 109/56 |
| 6,000,767 A | * | 12/1999 | Liu et al. | |
| 6,376,770 B1 | * | 4/2002 | Hyde | 174/58 |

* cited by examiner

*Primary Examiner*—Stephen R. Funk
*Assistant Examiner*—Wasseem H. Hamdan
(74) *Attorney, Agent, or Firm*—Bennet K. Langlotz; William K. Bucher

(57) ABSTRACT

An electronic instrument with a housing in the form of a rectangular body. The housing has a front panel with a display screen, and opposed side panels extending perpendicularly from the front panel to a rear panel. The housing defines a cavity adjacent to the rear panel and at least one of the side panels. The cavity includes a recessed panel portion having attached electronic connectors, so that cables connected to the connectors can flex to avoid protruding from the side panel to facilitate rack mounting, and may extend without protruding from the rear panel for bench usage. A circuit board to which the connectors and a microprocessor are connected may be oriented parallel to the rear panel, allowing a limited front-to-rear depth for the housing.

4 Claims, 3 Drawing Sheets

INSTRUMENT WITH HOUSING HAVING RECESS FOR CONNECTORS

FIELD OF THE INVENTION

The invention relates to electronic instruments housing configurations, and more particularly to orientation of external connectors.

BACKGROUND AND SUMMARY OF THE INVENTION

Electronic instruments such as oscilloscopes ("scopes") are employed for test and measurement of circuitry and other electronic devices and systems. Often, the oscilloscope is set up on a bench along with the device under test, with wire connections made between the two. Normally, the scope has a front display screen and user interface control panel on its front panel surface, which is oriented vertically or nearly vertically as the scope rests on the bench. To make room for the device under test, the scope is commonly positioned at the rear of the bench, with the device immediately in front of the scope, if there is adequate room.

While convenient for some oscilloscope configurations, certain scopes are not well suited to this convenient arrangement with the device under test. Certain oscilloscopes include personal computer (PC) circuitry inside, using the powerful microprocessors that are available at a relatively low cost. These scopes provide great speed and computational power for a low price compared to scopes with custom designed microprocessors. The PC microprocessors used in oscilloscopes are normally mounted on conventional PC mother boards, to which other circuit boards are typically connected. External devices such as printers, other computers, or networks are often connected to such scopes by cables connected to electronic connectors mounted to a rear panel of the scope housing, and connected internally to the mother board.

Oscilloscopes using PC processors and motherboard have been built with housings necessarily large to accommodate these components and other oscilloscope circuitry and components. The motherboard in such a system is oriented in a vertical or horizontal plane extending from front to back in the instrument, to allow the connectors to be mounted on the rear panel. This necessitates a significantly larger housing depth (front-to-back) than would be desired, making it often impractical to position the device under test in front of the scope. Moreover, the cables and their connectors generally protrude further from the rear panel, increasing the effective depth of the instrument.

It is also desirable to be able to secure the scope in a rack mount, in which only the rectangular front panel of the scope is exposed, and the remainder of the instrument is concealed within a rack cabinet. This precludes a reorientation of the mother board to reduce cabinet depth, because such would position the cable connectors on a side of the housing. Cables would thus protrude, and it would be impossible to insert the scope into a rack slot closely sized to fit the housing and front panel.

The embodiments disclosed herein overcome these limitations by providing an electronic instrument with a housing in the form of a rectangular body. The housing has a front panel with a display screen, and opposed side panels extending perpendicularly from the front panel to a rear panel. The housing defines a cavity adjacent to the rear panel and at least one of the side panels. The cavity includes a recessed panel portion having attached electronic connectors, so that cables connected to the connectors can flex to avoid protruding from the side panel to facilitate rack mounting, and may extend without protruding from the rear panel for bench usage. A circuit board to which the connectors and a microprocessor are connected may be oriented parallel to the rear panel, allowing a limited front-to-rear depth for the housing.

DETAILED DESCRIPTION OF A PREFERRED EMBODIMENT

Figure 1:
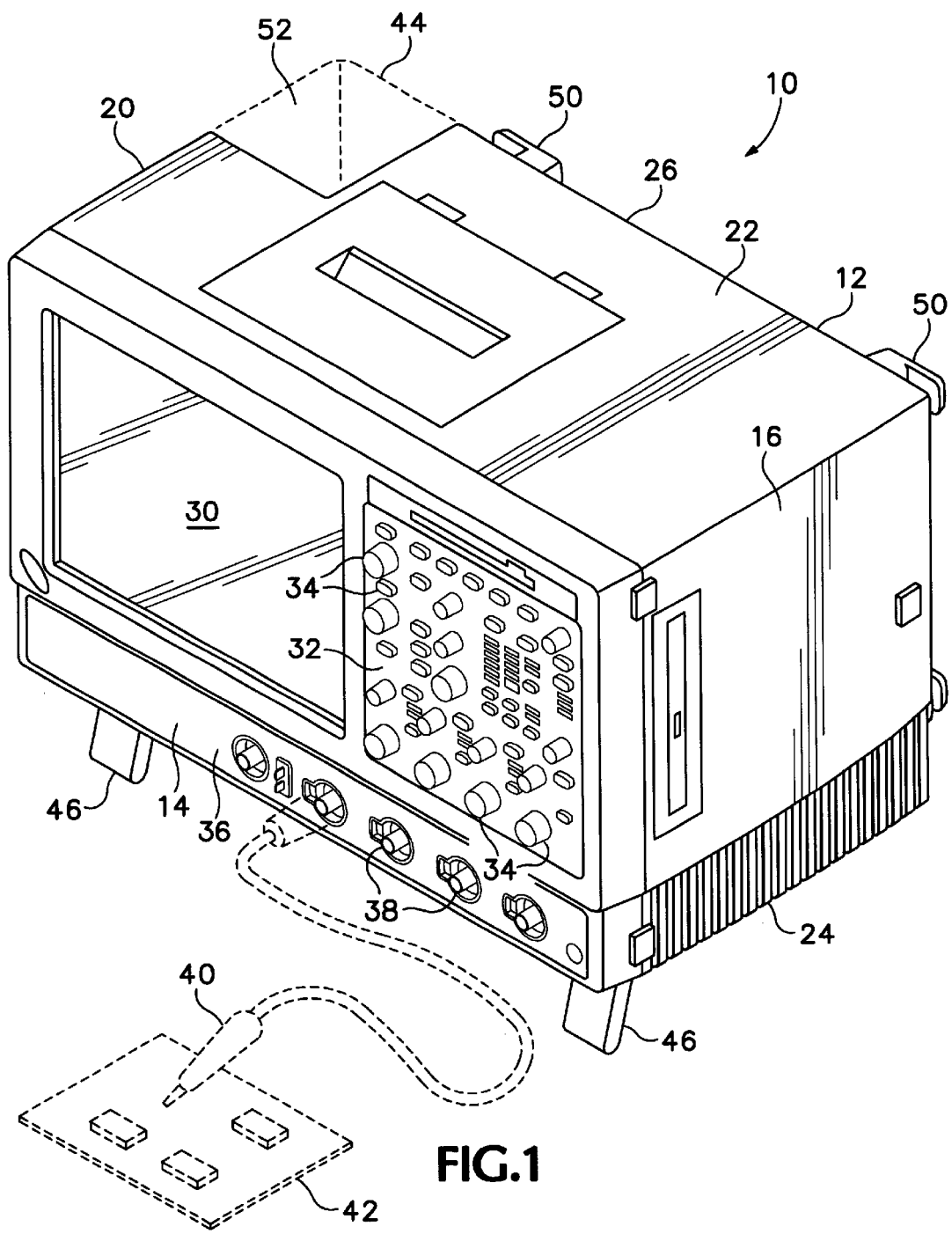
FIG. 1 is an isometric view of an according to a preferred embodiment of the invention.

FIG. 1 shows an oscilloscope (scope) 10 having a housing 12 with a generally rectangular shape. The housing has a vertical rectangular front panel 14, a right side panel 16, a left side panel 20, a top panel 22, a bottom panel 24, and a rear panel 26. The front panel includes a display screen 30, a control interface panel 32 having an array of buttons and control knobs 34, and a probe connector panel 36 with several connectors 38 for connecting cable probes 40 to an electronic circuit or device 42 under test. In the preferred usage, the oscilloscope rests on a horizontal bench surface, with the device 42 positioned on the surface in front of the scope.

The housing shape is defined by an envelope 44 that has an overall parallelepiped or rectangular volume. The preferred embodiment departs slightly from a perfect rectangular body, to provide draft angles to facilitate molding manufacturing operations, and radiused edges and corners to eliminate sharp features. In alternative embodiments, the envelope may have more significantly rounded corners or surfaces, including having the form of an oblong, cylinder, or ovoid. The envelope is preferably a regular, symmetrical shape, or any other shape driven by the physical constraints defined by the space the instrument is to occupy.

In the preferred embodiment, it is desired that the instrument housing envelope have limited depth, so that it can be positioned against a back wall at the rear of a bench without the front panel extending excessively far forward, leaving adequate bench surface forward of the front panel on which the device under test may rest.

The rectangular front panel provides a close fit in a rack mount or shelf application, in which a rectangular opening is defined between other instruments above and below, and between vertical straight rails to the left and right is a rectangle in which the entire instrument closely fits. Thus, the volume of the envelope maximally utilizes the volume available in a rack mount. The instrument may be provided with brackets (not shown) at the left and right edges of the front panel for direct mounting to rack rails, or may rest on a shelf mounted to rack rails.

The instrument housing shape departs from the envelope in several unimportant ways, and in one significant way. The housing includes hinged retractable legs 46 at the forward edge of the lower panel that allow the front panel to be tilted slightly upward for bench viewing. These legs protrude from the envelope when deployed, but are not considered meaningful departures for the purpose of this disclosure. Similarly, various of the control knobs 34, connectors 38, cable wrap guides 50, display screen bezel, and other small elements depart insignificantly above and below the envelope. These departures are considered insignificant because they do not limit or affect the size of the space in which the scope may be positioned, nor do they significantly affect the useful volume of the housing nor the size and shape of elements that may be contained within the housing. In an alternative embodiment, the cavity may be defined on only two sides of the housing, with the third cavity panel omitted so that the cavity extends the full height of the instrument through both the top and bottom panels.

Figure 2:
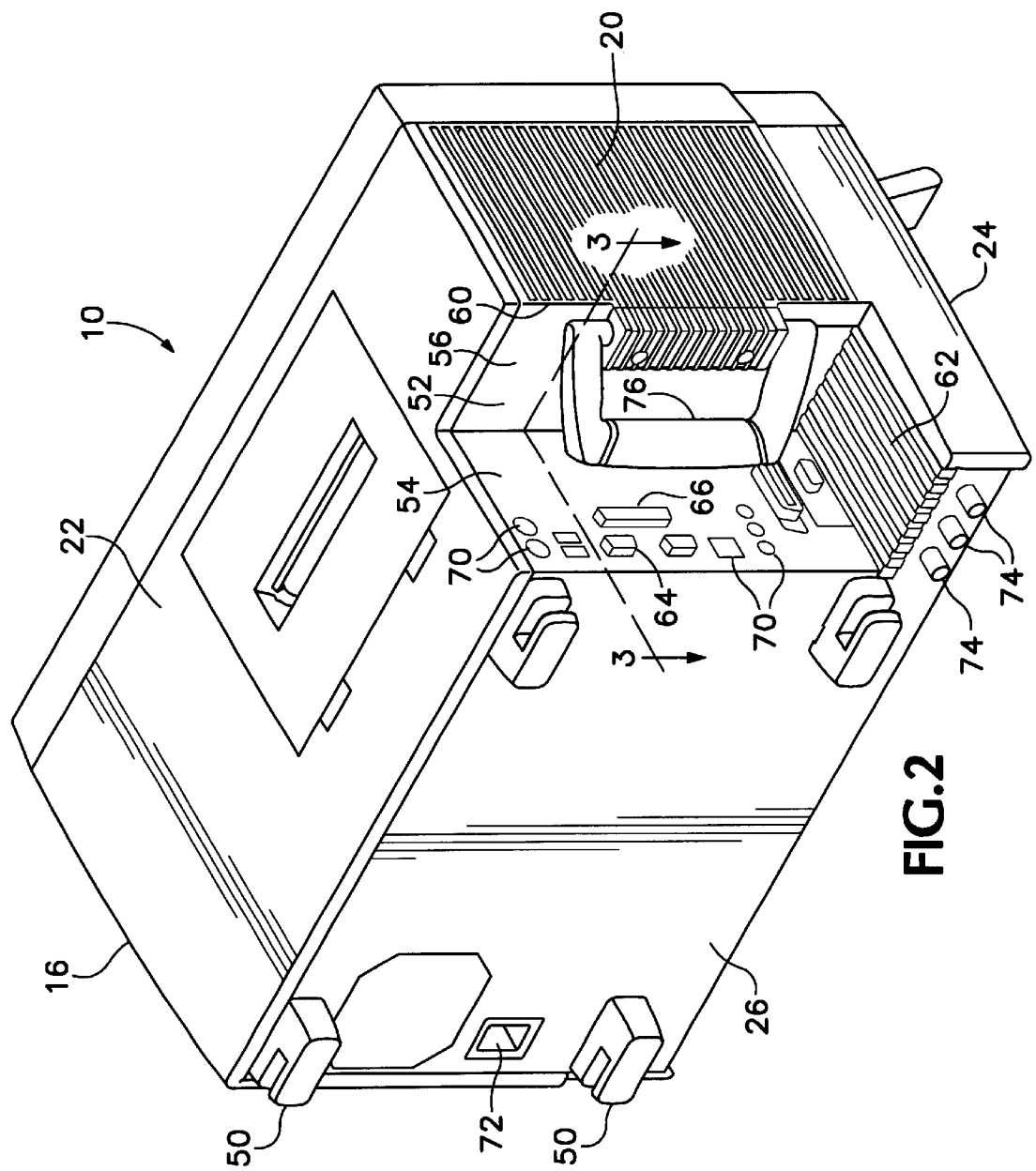
FIG. 2 is an isometric view of the embodiment of FIG. 1.

The significant departure of the housing from the envelope is a cavity 52, as shown in FIG. 2. The cavity is a rectangular space cut from one corner of the envelope, and defined on three sides by surface of the housing. A recessed lateral-facing surface 54 is perpendicular to the top and rear panels 22, 26, and parallel to and recessed with respect to the side panel 20. It is a rectangular flat surface that extends nearly the full height of the housing, less than half the depth of the housing, and is recessed about one quarter the width of the housing. A rear facing surface 56 is parallel to the rear panel, and extends from the forward edge of the lateral panel 54 to an edge 60 of the side panel 20. A third cavity panel 62 faces upward to define the bottom of the cavity.

A plurality of electrical connectors 64, 66, 70 are mounted to the lateral panel 54. These are of a variety of types common to personal computers, including multi-pin serial port chassis mounted connectors 64, 66, which are intended for connection to compatible connectors on cables that connect to printers, other instruments, external monitors, computers or networks. Other connectors receive cable terminals that connect to peripherals such as mouse or other input devices. The rear panel further includes a power receptacle 72, and additional high speed signal connectors 74 for connecting with BNC cables. A pivoting handle 76 is mounted to the edge 60, and may be stowed in the cavity, or deployed for carrying the instrument.

Figure 3:
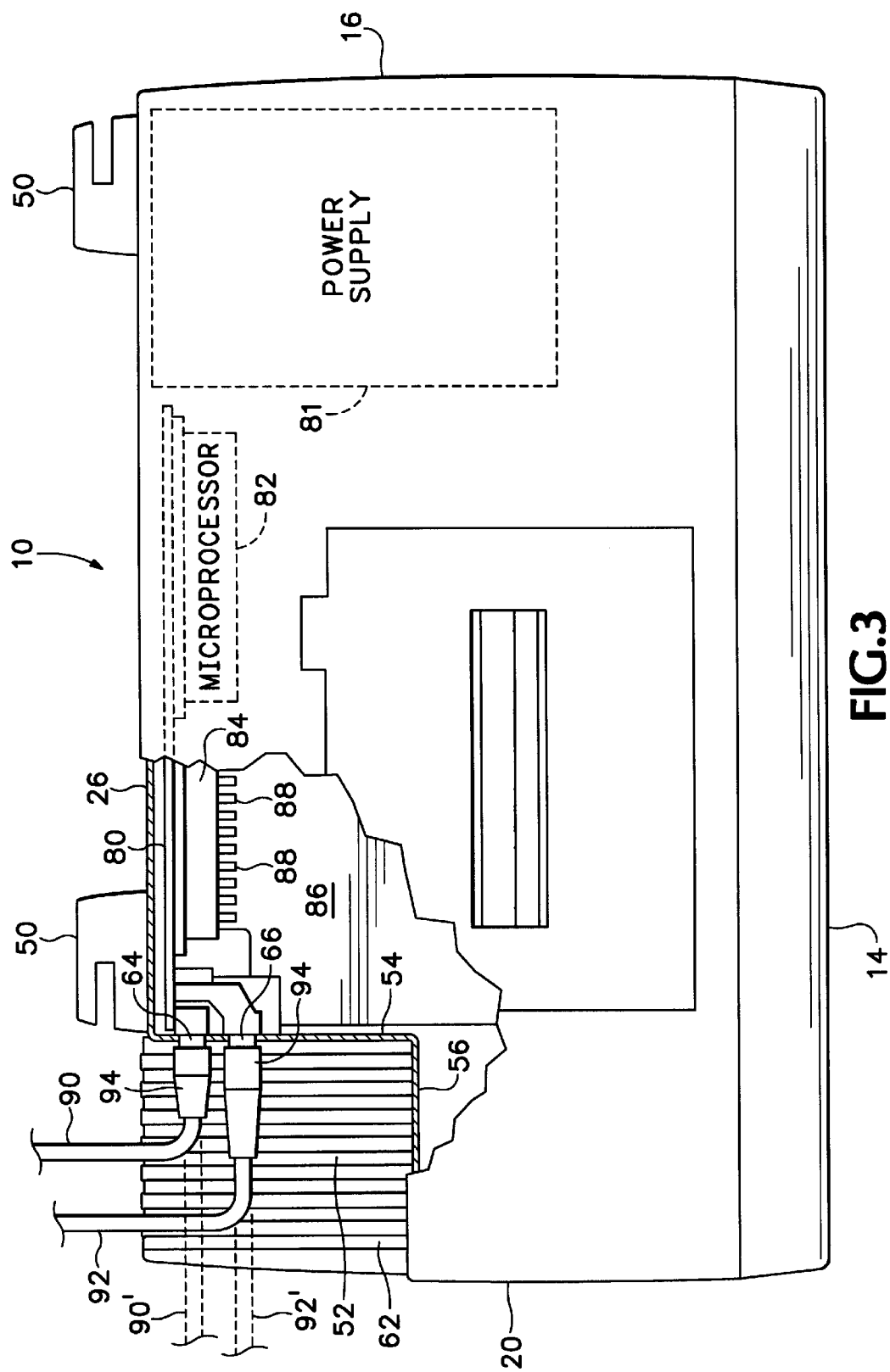
FIG. 3 is a sectional plan view of the embodiment of FIG. 1, taken along line 3—3.

FIG. 3 shows a portion of the circuitry inside the oscilloscope 10. A motherboard 80 is positioned parallel to and adjacent the back panel 26. A power supply 81 occupies a portion of the housing volume adjacent to the back panel 26 and right side panel 16. The motherboard extends the full width defined between the power supply 81 and the recessed panel portion 54. The board includes connected components in the same manner of a personal computer, with a microprocessor 82, one or more board slot connectors 84, each oriented horizontally, and several input/output connectors 64, 66 for connection to external elements as discussed above. A PCI board 86 is a circuit board having conductive edge contacts 88 that are received in and connect with a slot connector 84 on the motherboard. The PCI board may include oscilloscope circuitry, other circuitry, or may include connections to other circuitry.

Cables 90 and 92 are connected to connectors 64 and 66, as other cables (not shown) are connected to other connectors in the cavity. Each cable has a terminal housing 94 that is a rigid body that mechanically connects to the respective connector on the scope. For rack mounting, each cable terminal housing resides entirely within the envelope and cavity 52, and a length of the cable that extends from each housing also resides in the cavity. Adequate room is provided for the cables to bend with sufficient radii to avoid any interference with the envelope in the plane of the left side panel. This prevents cable damage or interference when installing the scope in a rack mount configuration. The cables are also shown in dashed lines 90', 92' to illustrate their position when the scope is used in a bench top application positioned against a back wall or barrier. In this instance, the cables extend leftward from the connectors, without intersecting the plane of the rear panel.

In the preferred embodiment, the housing is 10 inches high, 17 inches wide, and 10 inches deep, excluding knobs, feet, and other minor protrusions. This provides a width to depth ratio of 1.7, as compared to a width to depth ratio of about 1.0 common to typical oscilloscopes that employ PC processors and mother boards in a conventional arrangement parallel to a side panel of bottom panel. The cavity is 8.5 inches high, 3.25 inches wide, and 4 inches deep. The mother board is 9.75 inches high and 9.5 inches wide.

While the above is discussed in terms of preferred and alternative embodiments, the claims are not intended to be so limited.

What is claimed is:

1. An electronic instrument comprising:

a housing in the form of a rectangular body;

the housing having a front panel including a display screen, the housing having opposed side panels extending perpendicularly from the front panel to a rear panel;

the housing defining a cavity residing at a corner of the housing adjacent to the rear panel and defined by three mutually perpendicular surfaces with one of the surfaces being perpendicular to the front panel and parallel to the side panels;

having attached electronic connectors.

2. The instrument of claim 1 wherein the housing has a lower panel and an upper panel, and wherein the cavity is defined at an upper rear corner of the housing, such that the connectors are accessible when the instrument resides on a work surface.

3. The instrument of claim 1 wherein the connectors define an insertion axis parallel to the front panel and perpendicular to the side panels.

4. The instrument of claim 1 wherein the instrument includes circuitry including a motherboard adjacent to and parallel to the rear panel.

* * * * *